(12) United States Patent
Sakata et al.

(10) Patent No.: US 8,829,952 B2
(45) Date of Patent: Sep. 9, 2014

(54) GATE DRIVE CIRCUIT

(71) Applicants: Hiroshi Sakata, Tokyo (JP); Akihisa Yamamoto, Tokyo (JP); Mitsutaka Hano, Tokyo (JP)

(72) Inventors: Hiroshi Sakata, Tokyo (JP); Akihisa Yamamoto, Tokyo (JP); Mitsutaka Hano, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/667,896

(22) Filed: Nov. 2, 2012

(65) Prior Publication Data

US 2013/0214822 A1    Aug. 22, 2013

(30) Foreign Application Priority Data

Feb. 22, 2012  (JP) .................... 2012-036450

(51) Int. Cl.
*H03K 3/00*    (2006.01)
(52) U.S. Cl.
USPC .......................................... 327/112; 327/109
(58) Field of Classification Search
CPC ............... H03K 19/018521; H03K 19/018585
USPC ................................................ 327/109, 112
See application file for complete search history.

(56) References Cited

U.S. PATENT DOCUMENTS

| 8,593,767 | B2 * | 11/2013 | Wu et al. .................... 361/18 |
| 2005/0194998 | A1 * | 9/2005 | Watanabe ..................... 327/109 |
| 2008/0272658 | A1 | 11/2008 | Kojori et al. |
| 2011/0102951 | A1 * | 5/2011 | Wu et al. .................... 361/18 |
| 2011/0107122 | A1 * | 5/2011 | Wang et al. ................... 713/300 |
| 2011/0204929 | A1 * | 8/2011 | Nakayama et al. ........... 327/109 |

FOREIGN PATENT DOCUMENTS

| JP | 05-161343 | 6/1993 |
| JP | 08-298786 | 11/1996 |
| JP | 2002-199741 A | 7/2002 |

OTHER PUBLICATIONS

An Office Action issued by the German Patent Office on Jan. 14, 2014, which corresponds to German Patent Application No. 10 2012 222 882.9 and is related to U.S. Appl. No. 13/667,896; with English language translation.

* cited by examiner

*Primary Examiner* — Ryan Jager
(74) *Attorney, Agent, or Firm* — Studebaker & Brackett PC

(57) ABSTRACT

A gate drive circuit of the present invention is a gate drive circuit for driving an insulated gate switching element, which comprises a control drive circuit for applying a driving voltage to a control terminal of the switching element at a predetermined timing, and a voltage monitoring circuit for monitoring both a first voltage which is a power supply voltage of the control drive circuit and a second voltage which negatively biases the control terminal of the switching element, and in the gate drive circuit, the control drive circuit cuts off an output when at least one of the first and second voltages monitored by the voltage monitoring circuit becomes lower than a threshold value. It is an object of the present invention to provide an insulated gate switching element which can suppress wrong ON.

16 Claims, 14 Drawing Sheets

F I G . 1
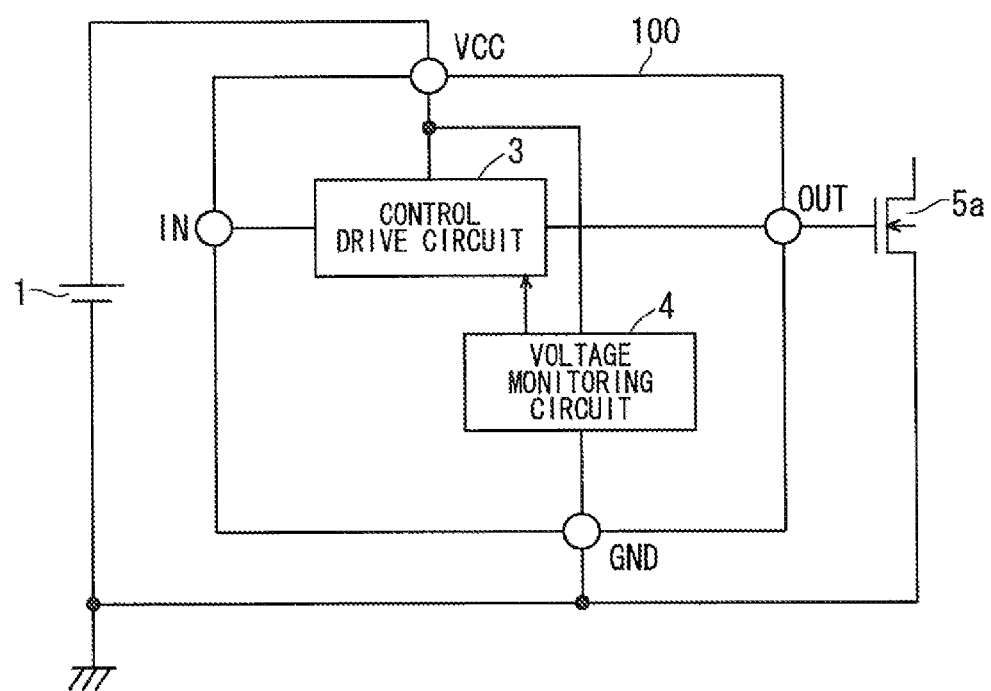

F I G . 2
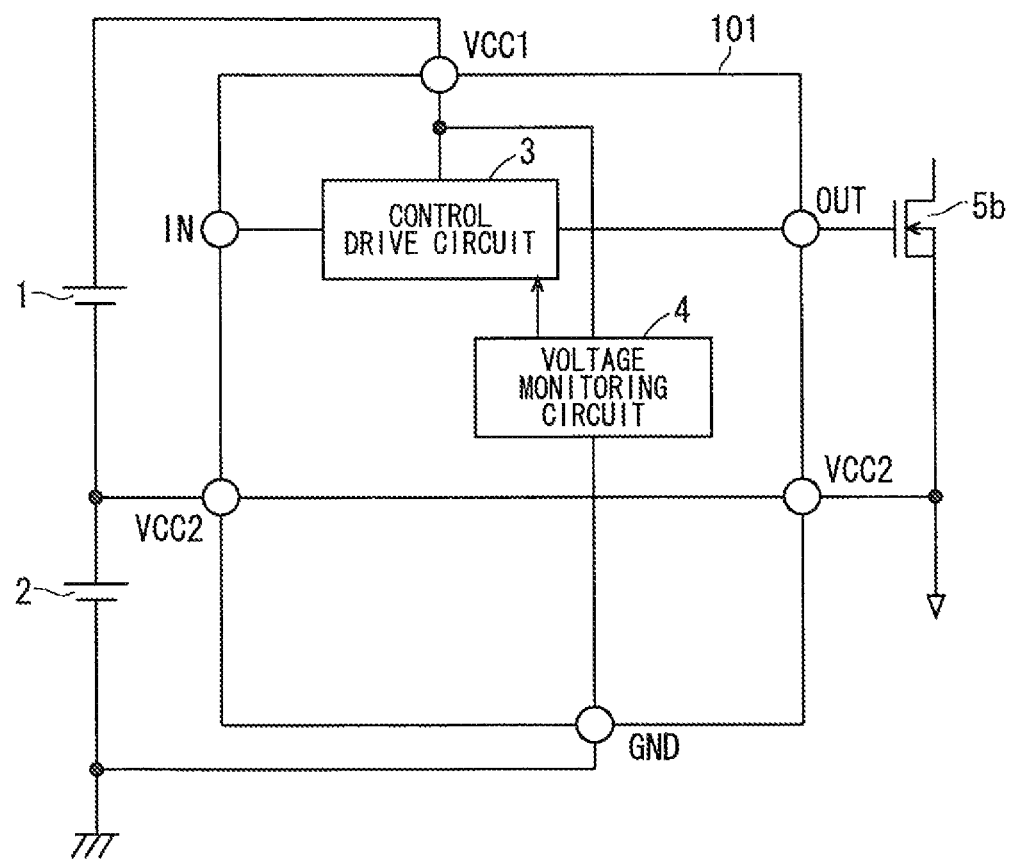

F I G. 9
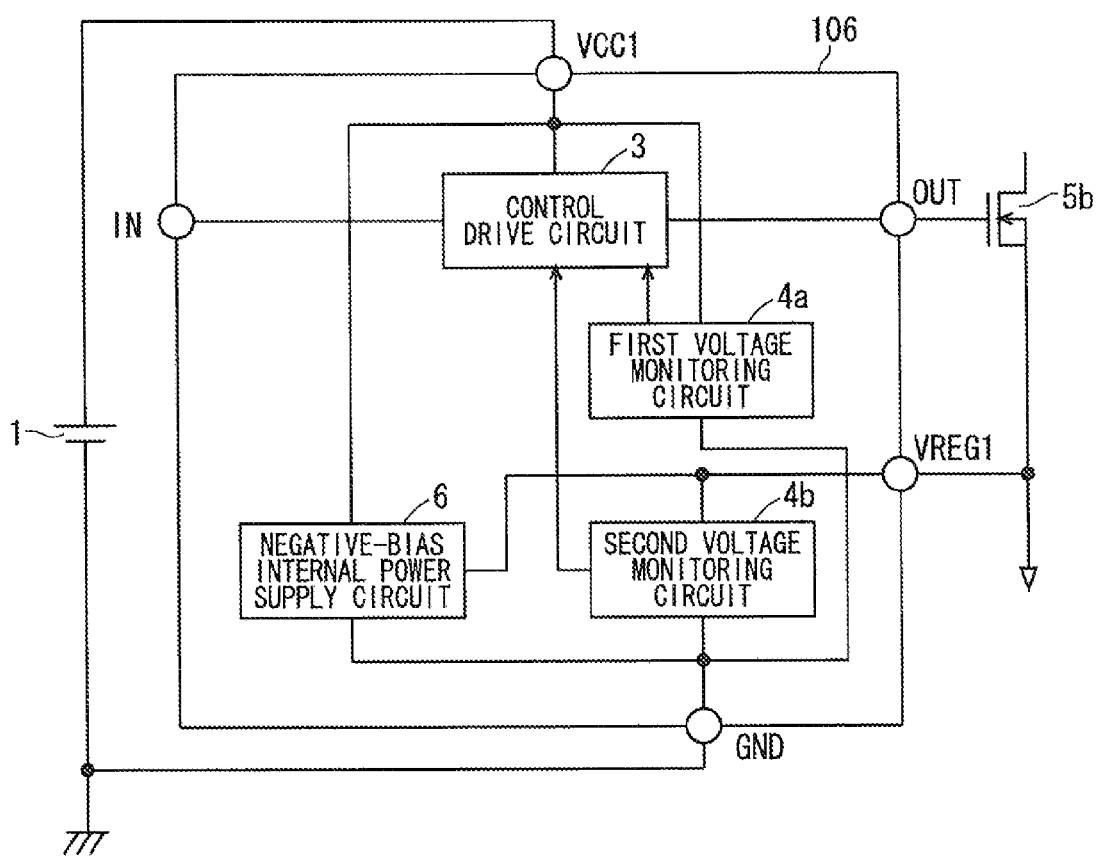

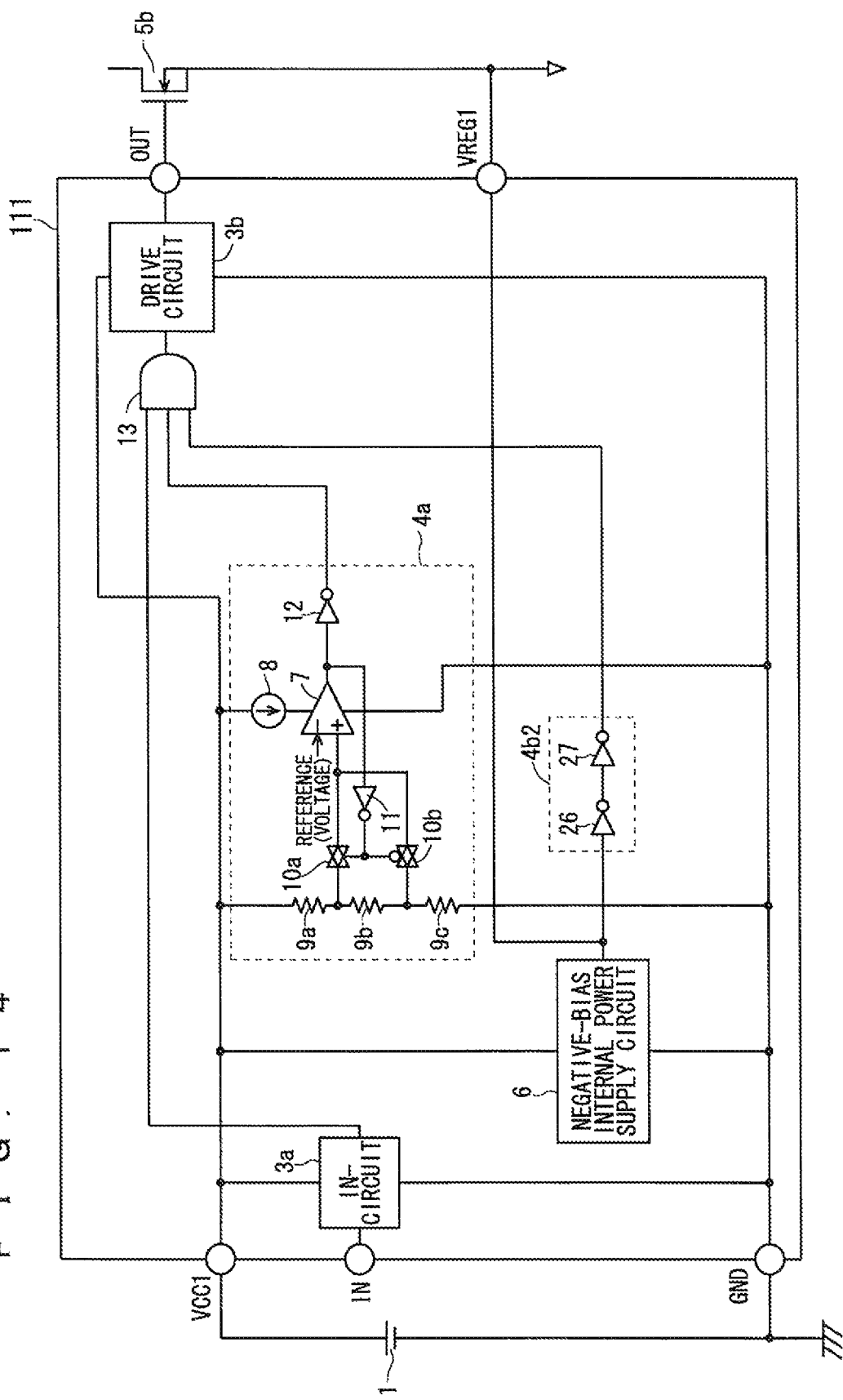

GATE DRIVE CIRCUIT

BACKGROUND OF THE INVENTION

1. Field of the Invention

The present invention relates to a drive circuit for an insulated gate semiconductor element.

2. Description of the Background Art

In gate drive control for an Si semiconductor element, generally, a source potential and a gate potential are made equal to each other at a turn-off.

In an insulated gate switching element, such as a SiC-MOS, which has a low threshold voltage Vth, however, when a source potential and a gate potential are equal to each other at a turn-off, there is a possibility that the insulated gate switching element may wrongly turn on by a slight increase in the output voltage of a drive circuit at a power-on.

Then, in Patent Document 1 (Japanese Patent Application Laid Open Gazette No. 8-298786), for example, disclosed is a configuration in which a negative bias is applied to a control terminal of a switching element and the control terminal becomes a negative potential as viewed from a main terminal at a turn-off, to thereby prevent the wrong ON.

When a power supply voltage of the drive circuit for the switching element rises earlier than the negative bias power supply at a power-on, however, since no negative bias is applied to the control terminal of the switching element at the instant, there is a problem that the switching element wrongly turns on when an output voltage of the drive circuit exceeds a threshold voltage of the switching element.

SUMMARY OF THE INVENTION

It is an object of the present invention to provide an insulated gate switching element which can suppress wrong ON.

The present invention is intended for a gate drive circuit for driving an insulated gate switching element. According to the present invention, the gate drive circuit comprises a drive circuit and a voltage monitoring circuit. The drive circuit applies a driving voltage to a control terminal of the switching element at a predetermined timing. The voltage monitoring circuit monitors both a first voltage which is a power supply voltage of the drive circuit and a second voltage which negatively biases the control terminal. The drive circuit cuts off an output when at least one of the first and second voltages monitored by the voltage monitoring circuit becomes lower than a threshold value.

With the configuration of the gate drive circuit, it is possible to prevent the switching element from wrongly turning on at a turn-off since the first voltage does not increase while the second voltage is low and the negative bias is not sufficient.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a gate drive circuit in accordance with an underlying technology;

FIG. 2 is a circuit diagram showing another gate drive circuit in accordance with the underlying technology;

FIG. 9 is a circuit diagram showing a gate drive circuit in accordance with a second variation of the first preferred embodiment;

FIG. 14 is a circuit diagram showing a gate drive circuit in accordance with a second variation of the third preferred embodiment.

DESCRIPTION OF THE PREFERRED EMBODIMENTS

<A. Underlying Technology>

Figure 3:
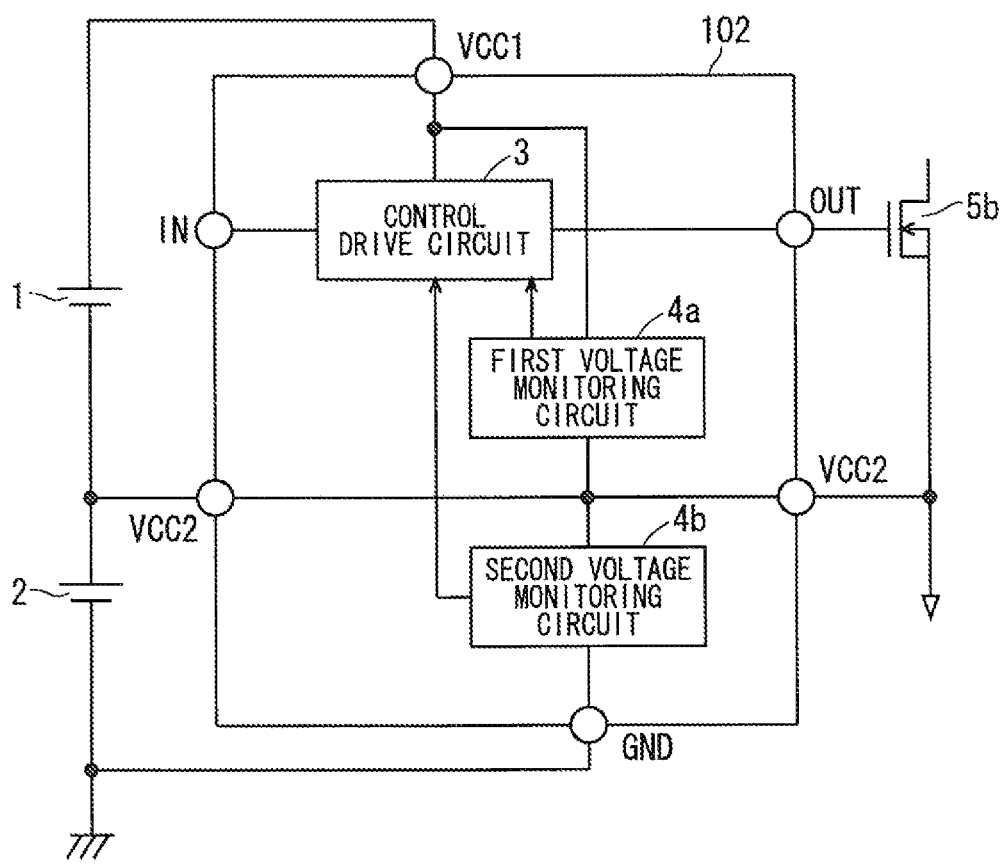
FIG. 3 is a circuit diagram showing a gate drive circuit in accordance with a first preferred embodiment.

FIG. 1 shows a gate drive circuit 100 for a Si-MOSFET 5a in accordance with an underlying technology of the present invention. The gate drive circuit may be formed as a semiconductor integrated circuit. The Si-MOSFET 5 is an example of an insulated gate switching element 5a. The gate drive circuit 100 comprises a control drive circuit 3 for applying a driving voltage to a gate terminal of the Si-MOSFET 5a and a voltage monitoring circuit 4 for monitoring a voltage of the control drive circuit 3. The control drive circuit 3 is supplied with a voltage VCC by a power supply 1 and applies a driving voltage to the gate terminal of the Si-MOSFET 5a from an output terminal OUT on the basis of an input signal from an input terminal IN.

The Si-MOSFET 5a is controlled so that a source potential and a gate potential thereof may become equal to each other at a turn-off. If a switching element to be driven is a SiC-MOSFET, the SiC-MOSFET is turned on with a slight driving voltage since a threshold voltage Vth thereof is low. For this reason, even if an output voltage of the control drive circuit 3 slightly increases when the power supply 1 is turned on, there is a possibility that the SiC-MOSFET wrongly turns on at a turn-off.

As a countermeasure against this, such a configuration as shown in FIG. 2 is thought to be effective, in which two power supplies 1 and 2 are provided and the power supply 2 is connected to a source terminal of a SiC-MOSFET 5b. With this configuration, since a gate potential is negatively biased with respect to a source potential by the voltage of the power supply 2, it is possible to prevent wrong ON of the SiC-MOSFET 5b.

If a voltage VCC1 of the power supply 1 rises earlier than a voltage VCC2 of the power supply 2 when the power supplies 1 and 2 are turned on, however, since no negative bias is applied to a gate terminal thereof, there is a problem that the SiC-MOSFET 5b wrongly turns on when a voltage not lower than the threshold voltage Vth is outputted.

Then, in a drive circuit of the present invention, in such a case as discussed above, the wrong ON can be suppressed by cutting off an output to the gate terminal.

<B. The First Preferred Embodiment>

FIG. 3 is a circuit diagram showing a configuration of a gate drive circuit 102 in accordance with the first preferred embodiment of the present invention. The gate drive circuit 102 for driving a gate which drives the SiC-MOSFET 5b comprises the control drive circuit 3, a first voltage monitoring circuit 4a, and a second voltage monitoring circuit 4b. The control drive circuit 3 applies the driving voltage VCC1 to the gate terminal of the SiC-MOSFET 5b from an output terminal OUT at a timing based on a signal from an input terminal IN. The power supply 1 is connected between the control drive circuit 3 and the source terminal of the SiC-MOSFET 5b and supplies the driving voltage VCC1 to the control drive circuit 3.

The power supply 2 is connected as a negative bias power supply between the source terminal of the SiC-MOSFET 5b and a ground (GND), and by applying the voltage VCC2 to the source terminal from the power supply 2, the gate terminal becomes a negative bias with respect to the source terminal. The power supply 2 is connected in series with the power supply 1 between the control drive circuit 3 and the ground.

The first voltage monitoring circuit 4a is provided between poles of the power supply 1, and monitors the driving voltage VCC1 and inputs a monitoring result to the control drive circuit 3. The second voltage monitoring circuit 4b is provided between poles of the power supply 2, and monitors the negative bias voltage VCC2 and inputs a monitoring result to the control drive circuit 3.

When at least one of the driving voltage VCC 1 and the negative bias voltage VCC2 becomes lower than a predetermined value, the control drive circuit 3 cuts off the output. With this operation, since the control drive circuit 3 applies the driving voltage VCC1 to the gate terminal only when sufficient negative bias voltage VCC2 is applied to the source terminal, it is possible to prevent the wrong ON.

Figure 4:
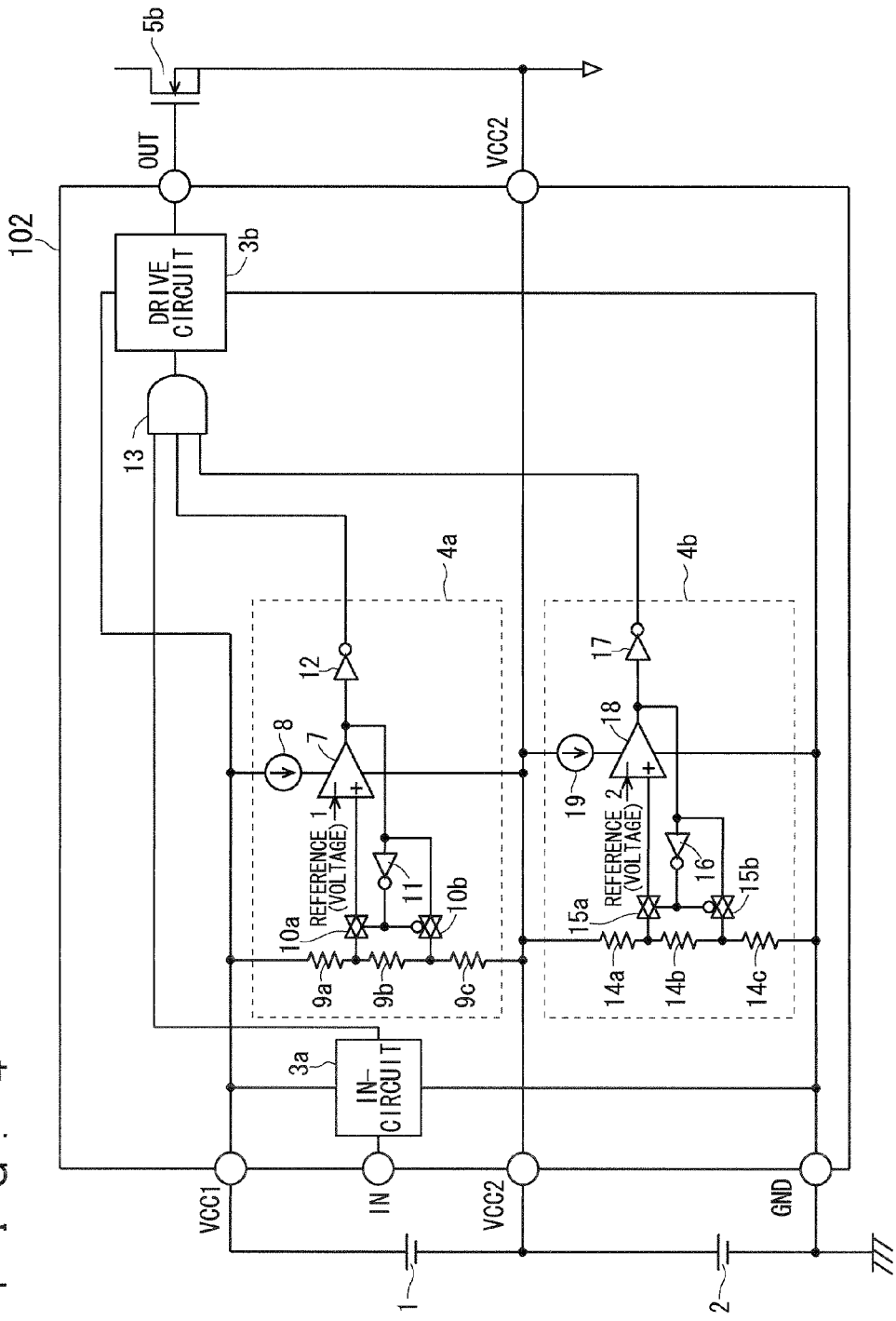
FIG. 4 is a circuit diagram showing the gate drive circuit in accordance with the first preferred embodiment.

With reference to FIG. 4, more detailed description will be made on the configuration of the gate drive circuit 102. The control drive circuit 3 consists of an ante-stage IN-circuit 3a and a post-stage drive circuit 3b. The IN-circuit 3a outputs a signal which is inputted to the input terminal IN of the gate drive circuit 102 from the outside, to an AND gate 13. The drive circuit 3b is provided between the positive pole of the power supply 1 and the ground GND and applies the voltage VCC1 to the gate terminal of the SiC-MOSFET 5b as the driving voltage on the basis of an input from the AND gate 13. The AND gate 13 outputs a logical product of the outputs from the IN-circuit 3a, the first voltage monitoring circuit 4a, and the second voltage monitoring circuit 4b to the drive circuit 3b.

The first voltage monitoring circuit 4a comprises voltage dividing resistors 9a, 9b, and 9c for dividing the voltage VCC1 of the power supply 1, a comparator 7 for comparing a divided voltage of the voltage VCC1 which is obtained by the voltage dividing resistor 9a or the voltage dividing resistor 9b with a reference voltage Reference 1 (corresponding to a threshold value), and a NOT gate 12 for inverting an output from the comparator 7. The output from the comparator 7 is fed back through a NOT gate 11 and brings one of transmission gates 10a and 10b connected to respective ends of the voltage dividing resistor 9b into conduction. One of power supply terminals of the comparator 7 is connected to the ground GND and the other is connected to the power supply 1 through a constant current source 8.

The voltage VCC1 of the power supply 1 is divided by the voltage dividing resistors 9a and 9b, and the divided voltage is applied to a noninverting input terminal of the comparator 7 through one of the transmission gates 10a and 10b and compared with the reference voltage applied to an inverting input terminal of the comparator 7. The voltage VCC1 is divided in order to be fallen within a range of the power supply voltage of the comparator 7. If the divided voltage of the voltage VCC1 to be inputted to the comparator 7 is higher than the reference voltage, the output of the comparator 7 becomes the same potential as the ground potential GND, going through the NOT gate 12, and is inputted to the AND gate 13 as a H (High) level voltage.

If the divided voltage of the voltage VCC1 to be inputted to the comparator 7 is lower than the reference voltage, the output voltage of the comparator 7 becomes VCC1, going through the NOT gate 12, and is inputted to the AND gate 13 as an L (Low) level voltage.

The second voltage monitoring circuit 4b has the same configuration as the first voltage monitoring circuit 4a and comprises voltage dividing resistors 14a, 14b, and 14c, transmission gates 15a and 15b, a comparator 18, NOT gates 16 and 17. One of power supply terminals of the comparator 18 is connected to the ground GND and the other is connected to the power supply 2 through a constant current source 19. The negative bias voltage VCC2 is divided by the voltage dividing resistors 14a and 14b, and the divided voltage is applied to a noninverting input terminal of the comparator 18 and compared with the reference voltage Reference 2 (corresponding to a threshold value) applied to an inverting input terminal of the comparator 18.

With the same operation as that in the first voltage monitoring circuit 4a, if the divided voltage of the negative bias voltage VCC2 is higher than the reference voltage, a H (High) level voltage is inputted to the AND gate 13, and if the divided voltage of the negative bias voltage VCC2 is lower than the reference voltage, an L (Low) level voltage is inputted to the AND gate 13.

The AND gate 13 outputs a logical product of the inputs from the IN-circuit 3a, the first voltage monitoring circuit 4a, and the second voltage monitoring circuit 4b to the drive circuit 3b. Even if the IN-circuit 3a outputs an ON signal, when at least one of the voltages VCC1 and VCC2 is not higher than a predetermined value, the L-level voltage is inputted to a control terminal of the drive circuit 3b. For this reason, the output of the gate drive circuit 102 is cut off and it is thereby possible to prevent the wrong ON.

Though the case is discussed, with reference to FIGS. 3 and 4, where the SiC-MOSFET 5b is to be driven, the effect of the present invention can be produced only if an insulated gate switching element having a low threshold voltage is to be driven.

Figure 5:
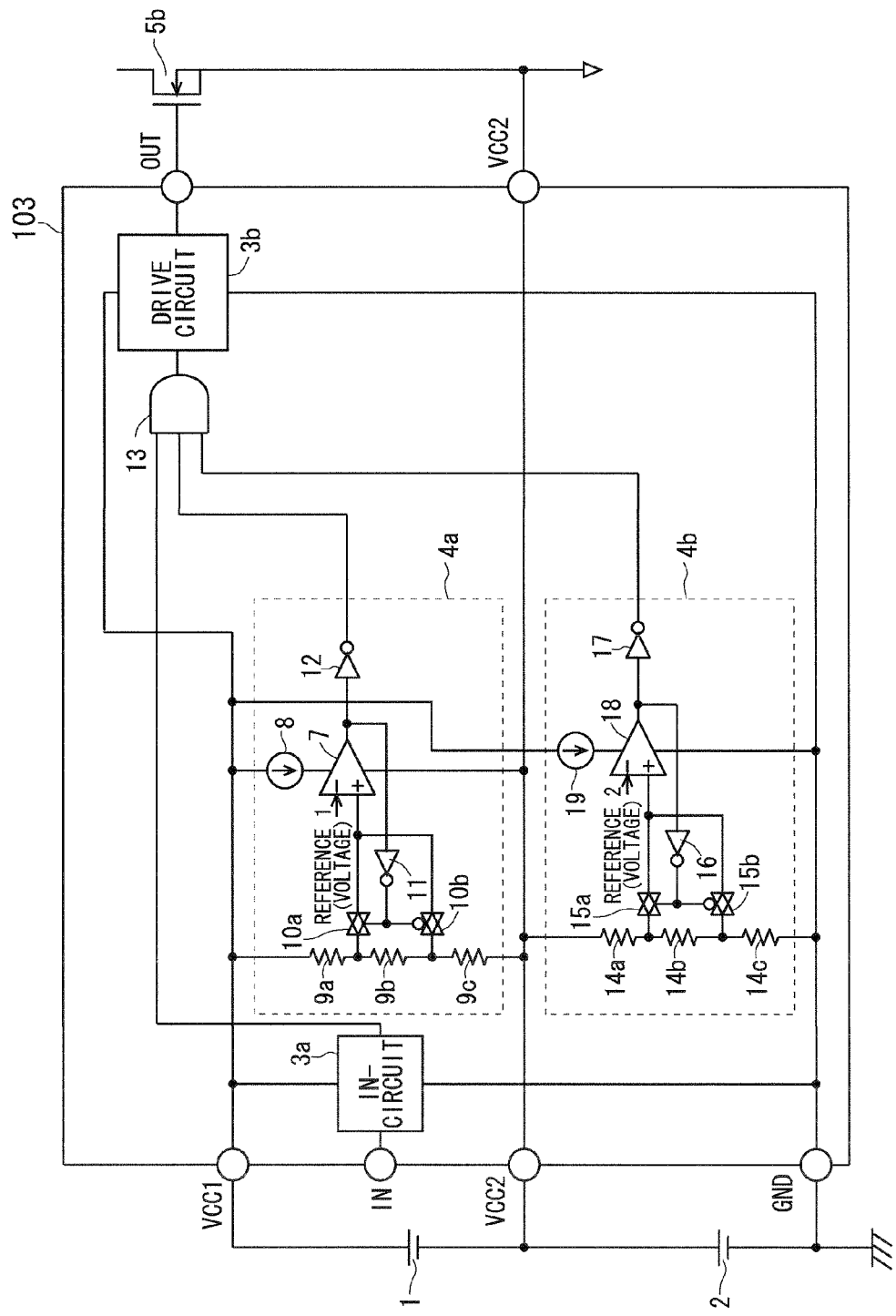
FIG. 5 is a circuit diagram showing another gate drive circuit in accordance with the first preferred embodiment.

Further, in the circuit configuration shown in FIG. 4, the power supply for the comparator 18 in the second voltage monitoring circuit 4b may have the maximum potential. FIG. 5 shows a gate drive circuit 103 having such a configuration. In the gate drive circuit 103, one of the power supply terminals of the comparator 18 is connected to the ground and the other is connected to the power supply 1 through the constant current source 19. The configuration of the gate drive circuit 103 other than the above is the same as that of the gate drive circuit 102. The gate drive circuit 103 having such a configuration can produce the same effect as that of the gate drive circuit 102.

<B-1. The First Variation>

Figure 6:
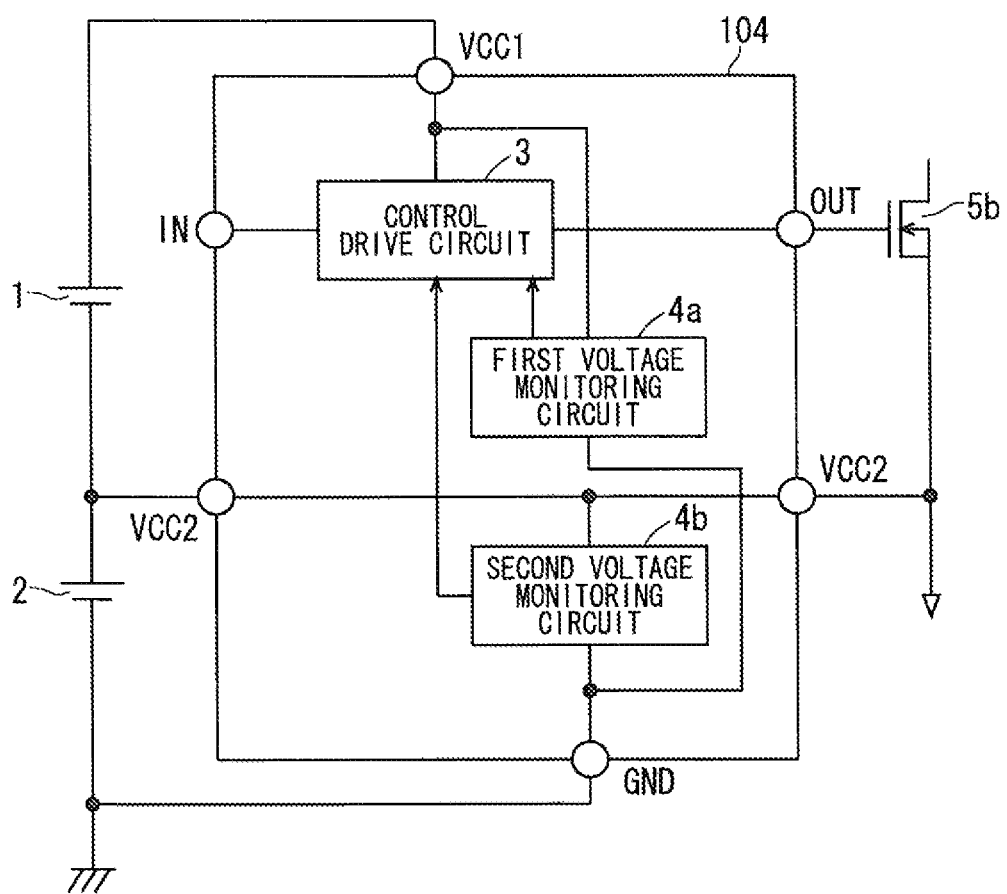
FIG. 6 is a circuit diagram showing the gate drive circuit in accordance with a first variation of the first preferred embodiment.

FIG. 6 is a circuit diagram showing a configuration of a gate drive circuit 104 in accordance with a first variation of the first preferred embodiment. In the gate drive circuit 104, the first voltage monitoring circuit 4a is connected between the positive pole of the power supply 1 and the ground GND and monitors a sum of the driving voltage VCC1 of the SiC-MOSFET 5b and the negative bias voltage VCC2 thereof, instead of only the driving voltage VCC1. The configuration of the gate drive circuit 104 other than the above is the same as that of the gate drive circuit 102. In the following figures used for explanation of the first variation, the constituent elements identical to those in the gate drive circuit 102 shown in FIGS. 3 and 4 are represented by the same reference signs.

Figure 7:
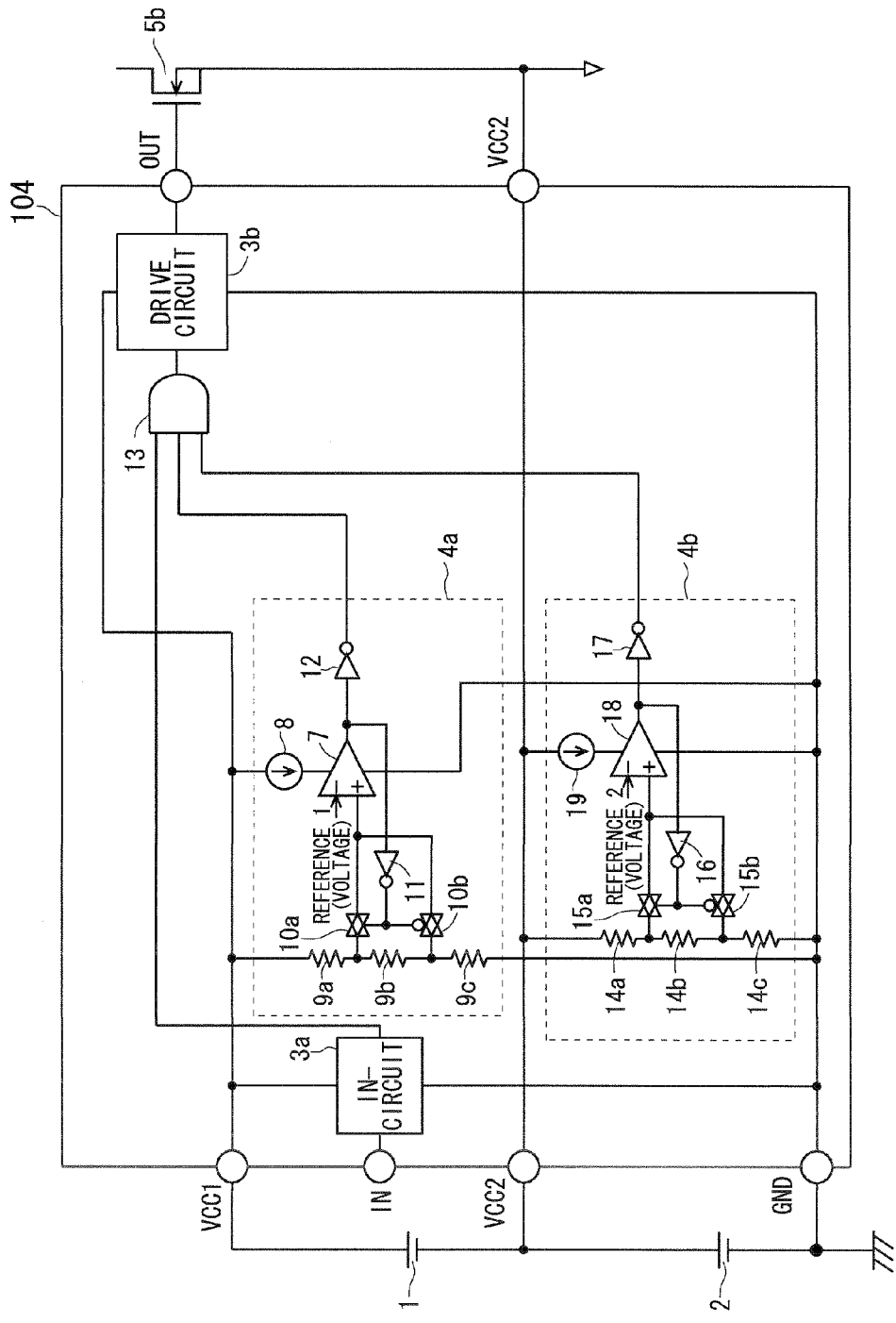
FIG. 7 is a circuit diagram showing the gate drive circuit in accordance with the first variation of the first preferred embodiment.

FIG. 7 is a circuit diagram showing the configuration of the gate drive circuit 104 in more detail. In the first voltage monitoring circuit 4a, the voltage dividing resistors 9a, 9b, and 9c are connected between the positive pole of the power supply 1 and the ground GND. One of the power supply terminals of the comparator 7 is connected to the ground GND and the other is connected to the power supply 1 through the constant current source 8. The configuration of the gate drive circuit 104 other than the above is the same as that of the gate drive circuit 102 shown in FIG. 4 and description thereof will be omitted. With the above-described configuration, a divided voltage of the voltages (VCC1+VCC2) is applied to the noninverting input terminal of the comparator 7 and the comparator 7 compares the divided voltage with the reference voltage. If one of the sum (VCC1+VCC2) and the voltage VCC2 is lower than a predetermined value, since the gate drive circuit 104 cuts off the output, it is possible to prevent the wrong ON due to the rise of the driving voltage VCC1 with the negative bias voltage VCC2 not being sufficiently applied.

Figure 8:
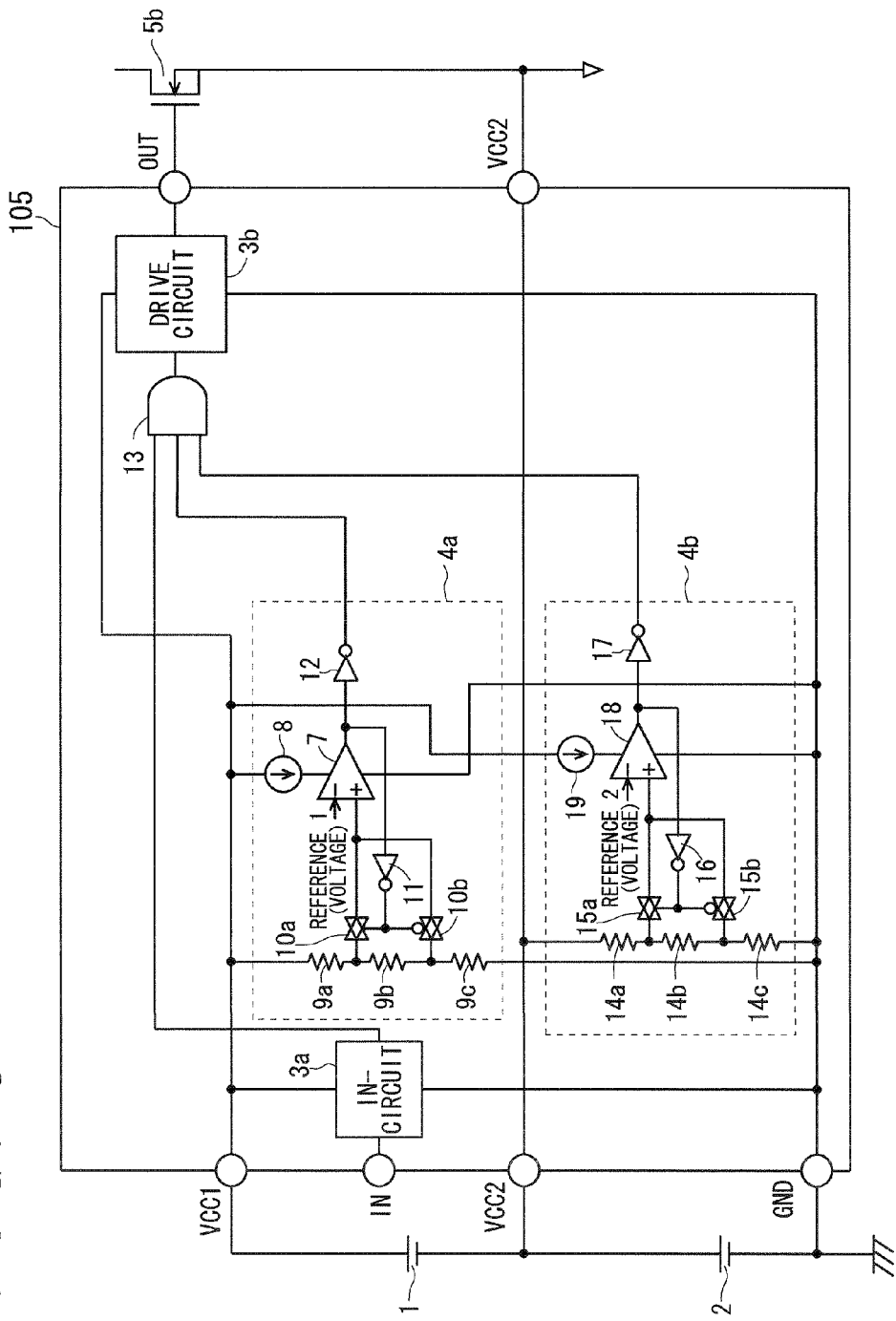
FIG. 8 is a circuit diagram showing another gate drive circuit in accordance with the first variation of the first preferred embodiment.

Further, in the circuit configuration shown in FIG. 7, the power supply for the comparator 18 in the second voltage monitoring circuit 4b may have the maximum potential. FIG. 8 shows a gate drive circuit 105 having such a configuration. In the gate drive circuit 105, one of the power supply terminals of the comparator 18 is connected to the ground and the other is connected to the power supply 1 through the constant current source 19. The configuration of the gate drive circuit 105 other than the above is the same as that of the gate drive circuit 104. The gate drive circuit 105 having such a configuration can produce the same effect as that of the gate drive circuit 104.

<B-2. The Second Variation>

A gate drive circuit in accordance with the second variation operates with a single power supply, not needing any additional power supply for negative bias and has a function of generating a negative bias voltage from the single power supply.

FIG. 9 is a circuit diagram showing a configuration of a gate drive circuit 106 in accordance with a second variation of the first preferred embodiment. In the following figures used for explanation of the second variation, the constituent elements identical to those in the gate drive circuit 104 shown in FIGS. 6 and 7 are represented by the same reference signs.

The gate drive circuit 106 operates with the single power supply 1. The control drive circuit 3 is supplied with the driving voltage VCC1 from the power supply 1 and applies the driving voltage VCC1 to the gate terminal of the SiC-MOSFET 5b from the output terminal OUT on the basis of an input signal from the input terminal IN.

The gate drive circuit 106 further comprises a negative-bias internal power supply circuit 6 provided between the positive pole of the power supply 1 and the ground GND, for dividing the driving voltage VCC1. Since a voltage VREG1 obtained by dividing the driving voltage VCC1 in the negative-bias internal power supply circuit 6 is applied to the source terminal of the SiC-MOSFET 5b, the gate terminal is negatively biased with respect to the source terminal.

The configuration of the gate drive circuit 106 other than the above is the same as that of the gate drive circuit 104 and description thereof will be omitted. Though the constitution of the gate drive circuit 104 is partially changed and the negative-bias internal power supply circuit 6 is additionally provided in the configuration of FIG. 9, there may be a case where the constitution of the gate drive circuit 102 is partially changed and the negative-bias internal power supply circuit 6 is additionally provided therein.

<B-3. Effects>

The gate drive circuit 102 of the first preferred embodiment is a gate drive circuit for driving an insulated gate switching element (SiC-MOSFET 5b) and comprises the control drive circuit 3 for applying a driving voltage to the control terminal of the SiC-MOSFET 5b at a predetermined timing and the voltage monitoring circuit for monitoring both the first voltage (driving voltage) VCC1 serving as a power supply voltage of the control drive circuit 3 and the second voltage (negative bias voltage) VCC2 which negatively biases the control terminal. Further, if at least one of the voltages VCC1 and VCC2 monitored by the voltage monitoring circuit becomes lower than a threshold value, the control drive circuit 3 cuts off the output. Therefore, it is possible to prevent the wrong ON due to the rise of the driving voltage VCC1 with the negative bias voltage VCC2 not being sufficiently applied.

Further, since the voltage monitoring circuit comprises the first voltage monitoring circuit 4a for monitoring the driving voltage VCC1 as a first monitored voltage and the second voltage monitoring circuit 4b for monitoring the negative bias VCC2 as a second monitored voltage, it is possible to prevent the wrong ON by cutting off the output of the gate drive circuit when at least one of the monitored voltages becomes lower than the threshold value.

In the gate drive circuit 104 in accordance with the first variation of the first preferred embodiment, since the first voltage monitoring circuit 4a monitors a sum of the driving voltage VCC1 and the negative bias voltage VCC2 as the first monitored voltage and the second voltage monitoring circuit 4b monitors the negative bias VCC2 as the second monitored voltage, it is possible to prevent the wrong ON by cutting off the output of the gate drive circuit when at least one of the monitored voltages becomes lower than the threshold value.

In the gate drive circuits 102 and 104, an external first power supply (power supply 1) connected between the control terminal and the main terminal of the SiC-MOSFET 5b supplies the driving voltage VCC1 and an external second power supply (power supply 2) connected between the main terminal of the SiC-MOSFET 5b and the ground supplies the negative bias voltage VCC2. It is possible to prevent the wrong ON by cutting off the output of the gate drive circuit when at least one of the driving voltage VCC1 and the negative bias voltage VCC2 which are supplied thus becomes lower than the threshold value.

In the gate drive circuit 106 in accordance with the second variation of the first preferred embodiment, an external single power supply (power supply 1) connected between the control terminal and the main terminal of the SiC-MOSFET 5b supplies the driving voltage VCC1 and the negative bias voltage VCC2 is internally generated as the divided voltage of the driving voltage VCC1. It is possible to prevent the wrong ON by cutting off the output of the gate drive circuit when at least one of the driving voltage VCC1 and the negative bias voltage VCC2 which are supplied thus becomes lower than the threshold value.

In the gate drive circuits 102, 104, and 106, the first voltage monitoring circuit 4a comprises a first comparator (comparator 7) for comparing the first monitored voltage with a first threshold value and the second voltage monitoring circuit 4b comprises a second comparator (comparator 18) for comparing the second monitored voltage with a second threshold value. It is possible to prevent the wrong ON by cutting off the output of the gate drive circuit on the basis of the comparison results in the above-described comparators 7 and 18.

In the gate drive circuits 103 and 105, the power supply voltage of the comparator 18 is a sum of the driving voltage VCC1 and the negative bias voltage VCC2. If an input voltage of the comparator 18 is a divided voltage of the negative bias voltage VCC2, even when the power supply voltage is the negative bias VCC2 or a sum of the negative bias voltage VCC2 and the driving voltage VCC1, the effect of the present invention can be produced.

<C. The Second Preferred Embodiment>

Figure 10:
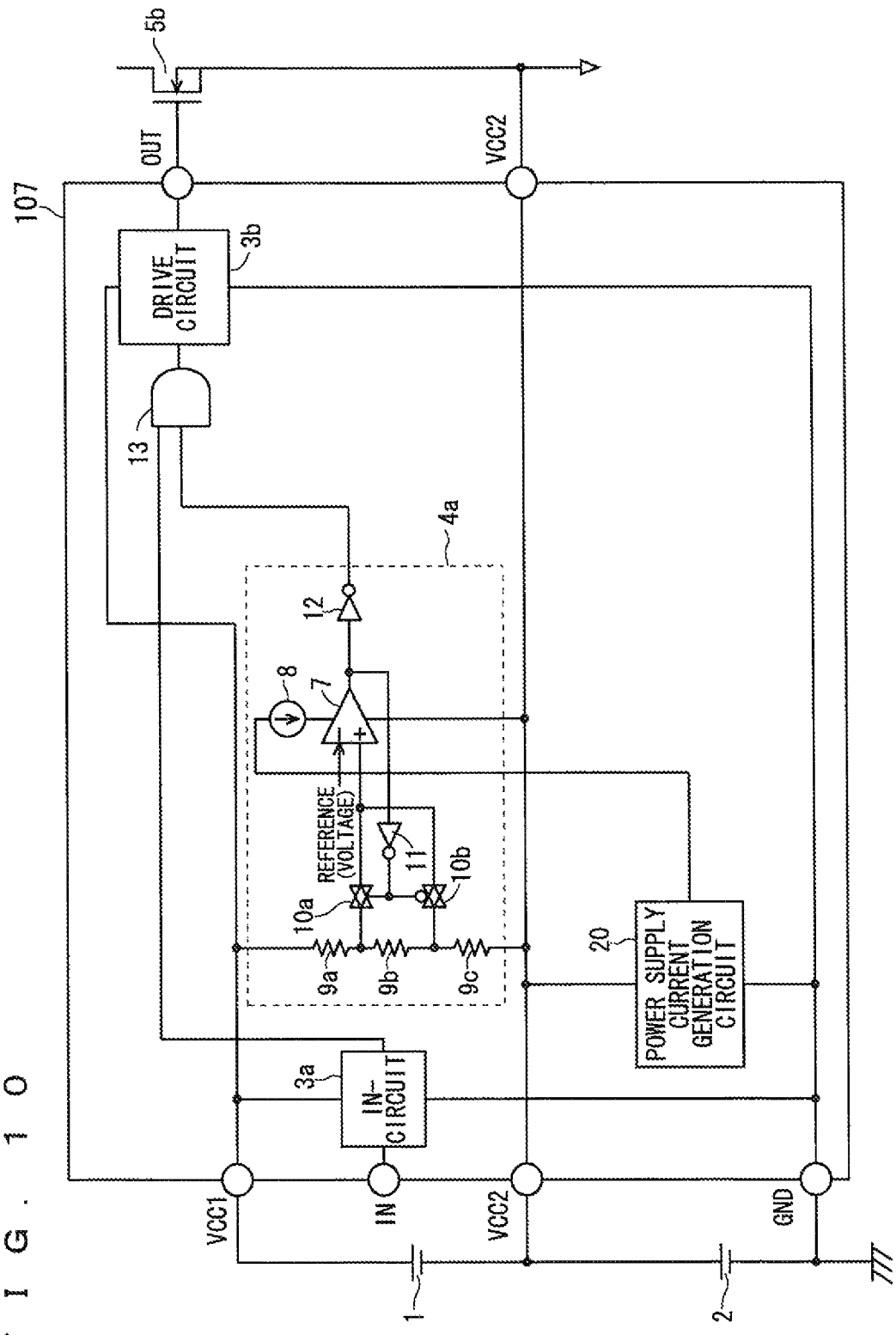
FIG. 10 is a circuit diagram showing a gate drive circuit in accordance with a second preferred embodiment.

FIG. 10 is a circuit diagram showing a configuration of a gate drive circuit 107 in accordance with the second preferred embodiment of the present invention. In FIG. 10, the constituent elements identical to those in the gate drive circuit 102 of the first preferred embodiment are represented by the same reference signs.

The gate drive circuit 107 comprises a power supply current generation circuit 20 connected between respective ends of the power supply 2, for monitoring the negative bias voltage VCC2, instead of the second voltage monitoring circuit 4b in the gate drive circuit 102 of the first preferred embodiment. The power supply current generation circuit 20 is a circuit which generates a current when the negative bias voltage VCC2 becomes not lower than a certain value. The current generated by the power supply current generation circuit 20 flows toward the comparator 7 on the side of the constant current source 8 in the first voltage monitoring circuit 4a as a power supply current.

The configuration of the gate drive circuit 107 other than the above is the same as that of the gate drive circuit 102 and description thereof will be omitted.

When no current flows from the power supply current generation circuit 20, and in other words, the negative bias voltage VCC2 is lower than a predetermined value, the output logic of the comparator 7 is "H" and the output of the first voltage monitoring circuit 4a through the NOT gate 12 is negative logic, and the output of the gate drive circuit 107 is thereby cut off. Thus, the power supply current generation circuit 20 operates as a second voltage monitoring circuit for monitoring the negative bias voltage VCC2 by generating the power supply current.

When the power supply current is supplied from the power supply current generation circuit 20, the comparator 7 compares the divided voltage of the driving voltage VCC1 with the reference voltage. If the divided voltage of the driving voltage VCC 1 is lower than the reference voltage, the comparator 7 outputs a H-level voltage and the output of the first voltage monitoring circuit 4a through the NOT gate 12 becomes negative logic. If the divided voltage of the driving voltage VCC1 is higher than the reference voltage, the comparator 7 outputs an L-level voltage and the output of the first voltage monitoring circuit 4a through the NOT gate 12 becomes positive logic.

With the above-discussed operation, since the output of the gate drive circuit 107 is cut off when at least one of the driving voltage VCC1 and the negative bias voltage VCC2 becomes lower than the predetermined value, it is possible to prevent the wrong ON due to the rise of the driving voltage VCC1 with the negative bias voltage VCC2 not being sufficiently applied.

<C-1. The First Variation>

Figure 11:
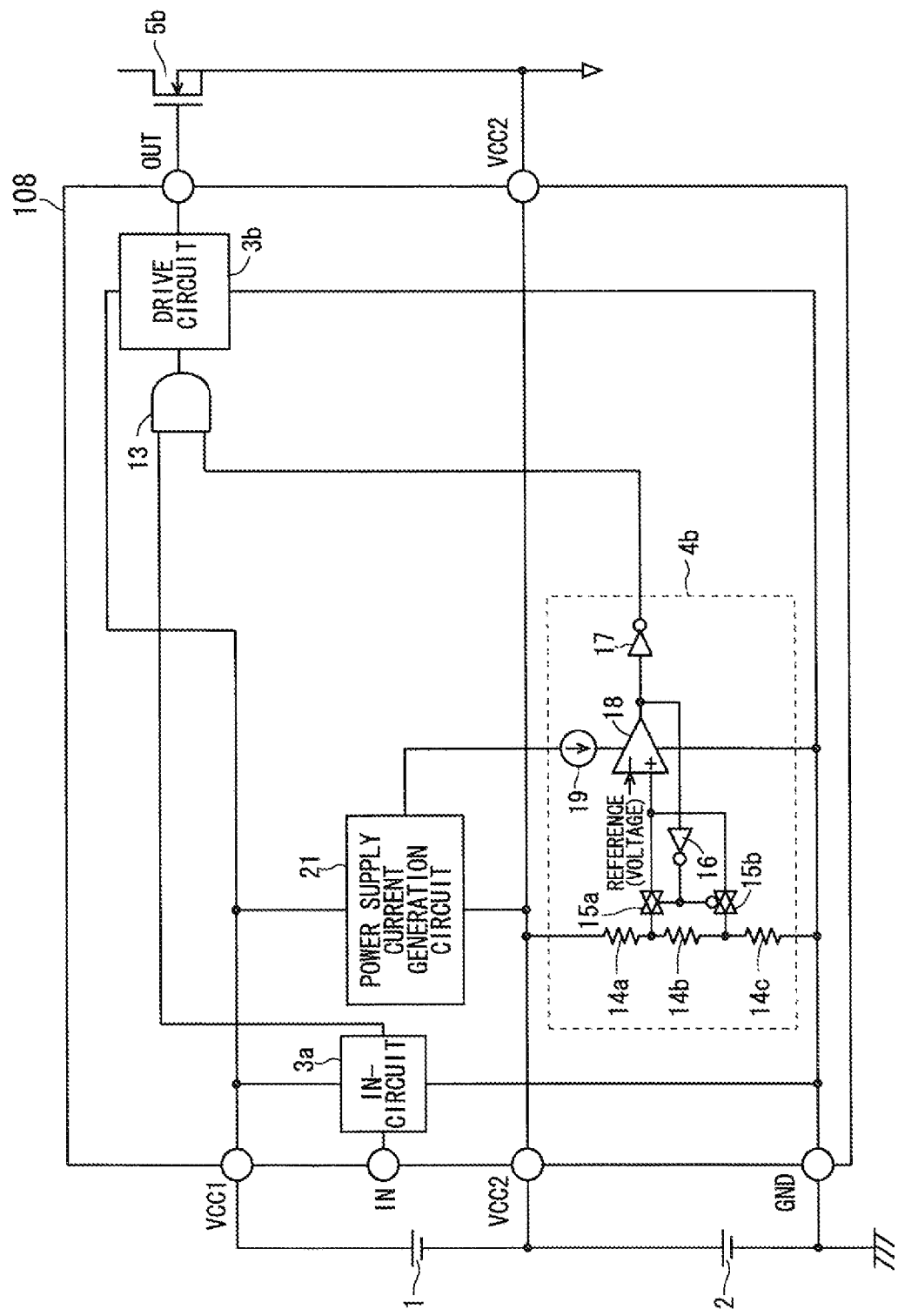
FIG. 11 is a circuit diagram showing a gate drive circuit in accordance with a first variation of the second preferred embodiment.

FIG. 11 is a circuit diagram showing a configuration of a gate drive circuit 108 in accordance with a first variation of the second preferred embodiment. In FIG. 11, the constituent elements identical to those in the gate drive circuit 102 of the first preferred embodiment are represented by the same reference signs.

The gate drive circuit 108 comprises a power supply current generation circuit 21 connected between respective ends of the power supply 1, for monitoring the driving voltage VCC1, instead of the first voltage monitoring circuit 4a in the gate drive circuit 102 of the first preferred embodiment. The power supply current generation circuit 21 is a circuit which generates a current when the driving voltage VCC1 becomes not lower than a predetermined value. The current generated by the power supply current generation circuit 21 flows toward the comparator 18 on the side of the constant current source 19 in the second voltage monitoring circuit 4b as a power supply current. The configuration of the gate drive circuit 108 other than the above is the same as that of the gate drive circuit 102 and description thereof will be omitted.

When no current flows from the power supply current generation circuit 21, and in other words, the driving voltage VCC1 is lower than a predetermined value, the output logic of the comparator 18 is "H" and the output of the second voltage monitoring circuit 4b through the NOT gate 17 is negative logic. Thus, the power supply current generation circuit 21 operates as a first voltage monitoring circuit for monitoring the driving voltage VCC1 by generating the power supply current.

When a bias current is supplied from the power supply current generation circuit 21, the comparator 18 compares the divided voltage of the negative bias voltage VCC2 with the reference voltage. If the divided voltage of the negative bias voltage VCC2 is lower than the reference voltage, the comparator 18 outputs a H-level voltage and the output of the second voltage monitoring circuit 4b through the NOT gate 17 becomes negative logic. If the divided voltage of the negative bias voltage VCC2 is higher than the reference voltage, the comparator 18 outputs an L-level voltage and the output of the second voltage monitoring circuit 4b through the NOT gate 17 becomes positive logic.

With the above-discussed operation, since the output of the gate drive circuit 108 is cut off when at least one of the driving voltage VCC1 and the negative bias voltage VCC2 becomes lower than the predetermined value, it is possible to prevent the wrong ON due to the rise of the driving voltage VCC1 with the negative bias voltage VCC2 not being sufficiently applied.

<C-2. Effects>

In the gate drive circuit 107 of the second preferred embodiment, the first voltage monitoring circuit 4a comprises the first comparator (comparator 7) for comparing the driving voltage VCC1 with the first threshold value and the second voltage monitoring circuit (power supply current generation circuit 20) generates the power supply current of the comparator 7 with the negative bias voltage VCC2. Since the power supply current is generated and the comparator 7 is operated with the power supply current when the negative bias voltage VCC2 becomes not lower than a certain value, the comparator 7 does not operate and the output of the gate drive circuit 107 can be thereby cut off when the negative bias voltage VCC2 is lower than the certain value.

In the gate drive circuit 108 in accordance with the first variation of the second preferred embodiment, the second voltage monitoring circuit 4b comprises the second comparator (comparator 18) for comparing the negative bias voltage VCC2 with the second threshold value and the first voltage monitoring circuit (power supply current generation circuit 21) generates the power supply current of the comparator 18 with the driving voltage VCC1. Since the power supply current is generated and the comparator 18 is operated with the power supply current when the driving voltage VCC 1 becomes not lower than a certain value, the comparator 18 does not operate and the output of the gate drive circuit 108 can be thereby cut off when the driving voltage VCC1 is lower than the certain value.

<D. The Third Preferred Embodiment>

Figure 12:
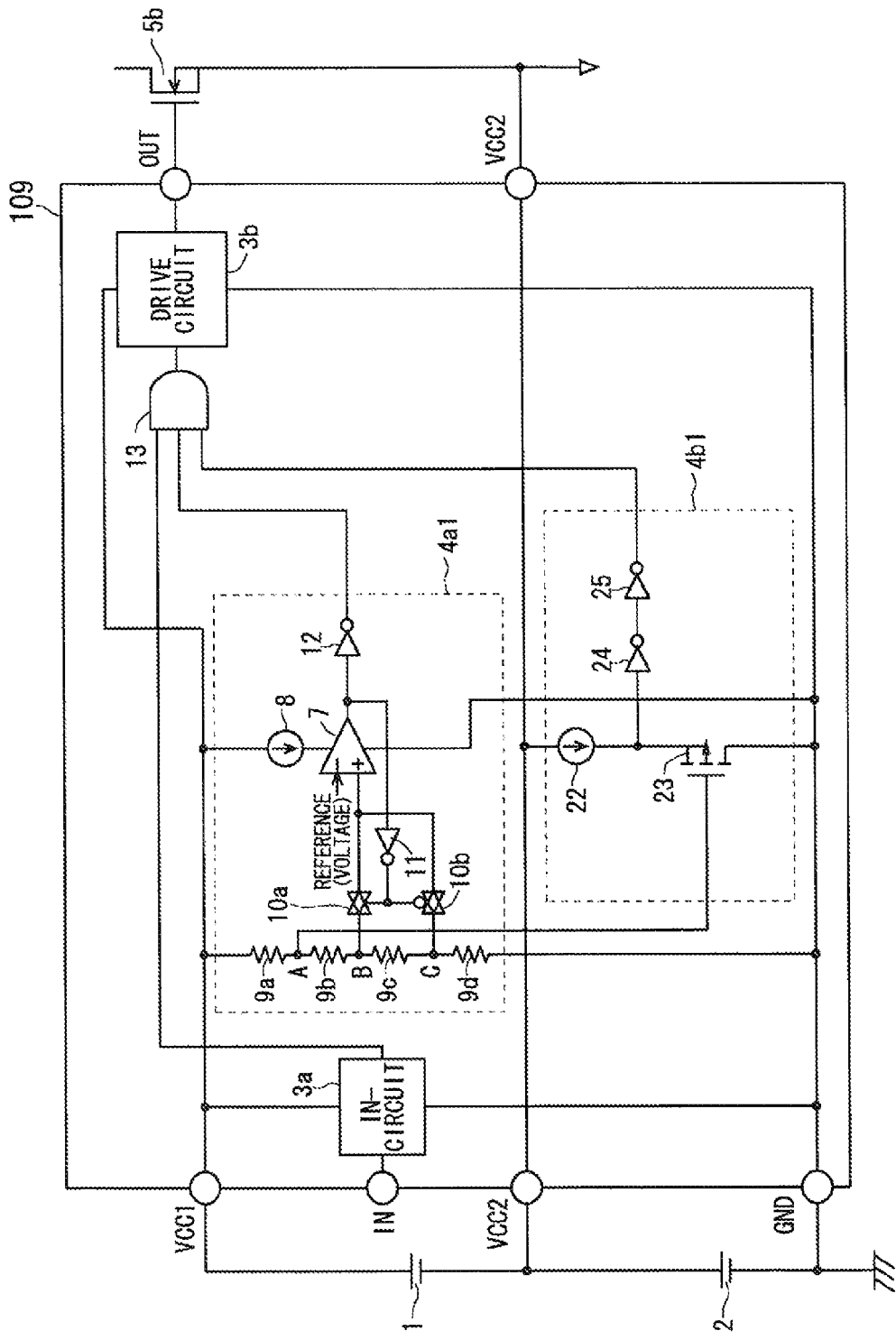
FIG. 12 is a circuit diagram showing a gate drive circuit in accordance with a third preferred embodiment.

FIG. 12 is a circuit diagram showing a configuration of a gate drive circuit 109 in accordance with the third preferred embodiment of the present invention. The gate drive circuit 109 comprises a first voltage monitoring circuit 4a1 and a second voltage monitoring circuit 4b1 instead of the first voltage monitoring circuit 4a and the second voltage monitoring circuit 4b, respectively, in the constitution of the gate drive circuit 104 in accordance with the first variation of the first preferred embodiment. The configuration of the gate drive circuit 109 other than the above is the same as that of the gate drive circuit 104 and description thereof will be omitted.

The first voltage monitoring circuit 4a1 comprises voltage dividing resistors 9a, 9b, 9c, and 9d provided between the positive pole of the power supply 1 and the ground GND. The noninverting input terminal of the comparator 7 is connected to a voltage dividing point B between the voltage dividing resistors 9b and 9c through the transmission gate 10a and further connected to a voltage dividing point C between the voltage dividing resistors 9c and 9d through the transmission gate 10b. The configuration of the first voltage monitoring circuit 4a1 other than the above is the same as that of the first voltage monitoring circuit 4a in the gate drive circuit 104.

The second voltage monitoring circuit 4b1 comprises a pMOSFET 23 having a gate terminal connected to a point A between the voltage dividing resistors 9a and 9b in the first voltage monitoring circuit 4a1. A source terminal of the pMOSFET 23 is connected to a positive pole of the power supply 2 through a constant current source 22. Further, two-stage NOT gates 24 and 25 are connected between the constant current source 22 and the source terminal of the pMOSFET 23, and the other end of the NOT gate 25 is connected to an input terminal of the AND gate 13, as an output of the second voltage monitoring circuit 4b1.

A divided voltage of the sum of the driving voltage VCC1 and the negative bias voltage VCC2 at the point A is applied to the gate terminal of the pMOSFET 23. When a gate voltage of the pMOSFET 23 is lower than a threshold value, the pMOSFET 23 is an ON state and an input of the NOT gate 24 is the ground GND. Therefore, an output of the NOT gate 25 is L level and this L-level output voltage is inputted to the AND gate 13, as the output of the second voltage monitoring circuit 4b1.

When the gate voltage of the pMOSFET 23 is not lower than the threshold value, the pMOSFET 23 is an OFF state and the negative bias voltage VCC2 is applied to the NOT gate 24. When the negative bias voltage VCC2 is lower than a threshold value of the NOT gate 24, an output voltage of the NOT gate 25 is L level, and when the negative bias voltage VCC2 is not lower than the threshold value of the NOT gate 24, the output voltage of the NOT gate 25 is H level. This output voltage is inputted to the AND gate 13, as the output of the second voltage monitoring circuit 4b1.

In other words, the first voltage monitoring circuit 4a1 monitors the sum of the driving voltage VCC1 and the negative bias voltage VCC2 by outputting the L-level voltage to the AND gate 13 when the sum of the driving voltage VCC1 and the negative bias voltage VCC2 is lower than a predetermined value.

Further, the second voltage monitoring circuit 4b1 monitors the negative bias voltage VCC2 by outputting the L-level voltage to the AND gate 13 when the sum of the driving voltage VCC1 and the negative bias voltage VCC2 is lower than the predetermined value and by outputting the L-level voltage to the AND gate 13 also when the sum of the driving voltage VCC1 and the negative bias voltage VCC2 is not lower than the predetermined value and the negative bias voltage VCC2 is not lower than the predetermined value.

With the above-discussed operation, since the output of the gate drive circuit 109 is cut off when at least one of the driving voltage VCC1 and the negative bias voltage VCC2 becomes not higher than the predetermined value, it is possible to prevent the wrong ON due to the rise of the driving voltage VCC1 with the negative bias voltage VCC2 not being sufficiently applied.

<D-1. The First Variation>

Figure 13:
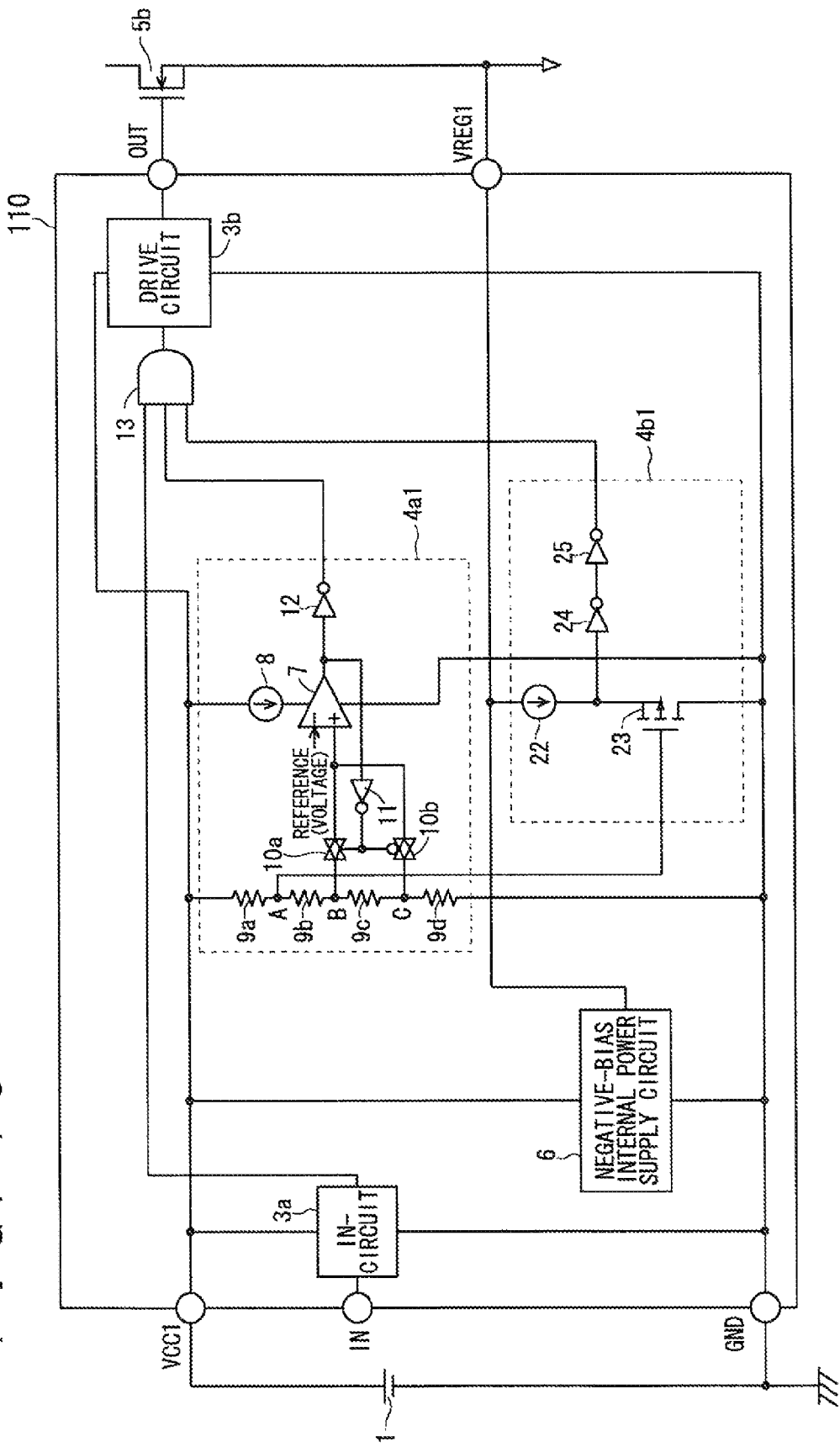
FIG. 13 is a circuit diagram showing a gate drive circuit in accordance with a first variation of the third preferred embodiment.

FIG. 13 is a circuit diagram showing a configuration of a gate drive circuit 110 in accordance with a first variation of the third preferred embodiment. The gate drive circuit 110 is operated with a single power supply by partially changing the configuration of the gate drive circuit 109. The gate drive circuit 110 is operated with the power supply 1 which supplies the voltage VCC1, and the negative-bias internal power supply circuit 6 is connected to the respective ends of the power supply 1.

The negative-bias internal power supply circuit 6 generates a voltage VREG1 by dividing the voltage VCC1 and applies the voltage VREG1 to the source terminal of the SiC-MOSFET 5b. The gate terminal of the SiC-MOSFET 5b is negatively biased with respect to the source terminal by the voltage VREG1.

The voltage VREG1 generated by the negative-bias internal power supply circuit 6 is also applied to the source terminal of the pMOSFET 23 through the constant current source 22. The configuration of the gate drive circuit 110 other than the above is the same as that of the gate drive circuit 109 and description thereof will be omitted.

Like in the gate drive circuit 109, since the output of the gate drive circuit 110 is cut off when at least one of the driving voltage VCC1 and the negative bias voltage VREG1 becomes not higher than the predetermined value, it is possible to prevent the wrong ON due to the rise of the driving voltage VCC1 with the negative bias voltage VREG1 not being sufficiently applied. Further, the single power supply 1 can provide both the gate driving voltage VCC1 and the negative bias voltage VREG1.

<D-2. The Second Variation>

FIG. 14 is a circuit diagram showing a configuration of a gate drive circuit 111 in accordance with a second variation of the third preferred embodiment. The gate drive circuit 111 comprises the first voltage monitoring circuit 4a and a second voltage monitoring circuit 4b2 instead of the first voltage monitoring circuit 4a1 and the second voltage monitoring circuit 4b1, respectively, in the constitution of the gate drive circuit 110 in accordance with the first variation. The configuration of the gate drive circuit 111 other than the above is the same as that of the gate drive circuit 110. Hereinafter, discussion will be made on the second voltage monitoring circuit 4b2.

The second voltage monitoring circuit 4b2 consists of two-stage NOT gates 26 and 27. The divided voltage VREG1 obtained by dividing the voltage VCC1 in the negative-bias internal power supply circuit 6 is applied to the NOT gate 26, and when the divided voltage VREG1 is not lower than a threshold value of the NOT gate 26, the NOT gate 26 outputs a H-level voltage and the NOT gate 27 outputs an L-level voltage. When the divided voltage VREG1 is lower than the threshold value of the NOT gate 26, the NOT gate 26 outputs an L-level voltage and the NOT gate 27 outputs a H-level voltage. The output of the NOT gate 27 is inputted to the AND gate 13, as an output of the second voltage monitoring circuit 4b2. With the above-described configuration, the second voltage monitoring circuit 4b2 monitors the negative bias voltage VREG1.

With the above-described configuration, since the output of the gate drive circuit 111 is cut off when the voltage VCC1 is lower than a predetermined value or the voltage VREG1 is lower than the predetermined value, it is possible to prevent the wrong ON due to the rise of the driving voltage VCC1 with the negative bias voltage VREG1 not being sufficiently applied.

Though the first voltage monitoring circuit 4a compares the driving voltage VCC1 with the reference voltage in FIG. 14, there may be a configuration where a difference between the driving voltage VCC1 and the negative bias voltage VREG1 is compared with the reference voltage.

<D-3. Effects>

In the gate drive circuits 109 and 110 of the third preferred embodiment, the first voltage monitoring circuit 4a1 comprises the comparator 7 for comparing the sum of the driving voltage VCC1 and the negative bias voltage VCC2 with the threshold value, and the second voltage monitoring circuit 4b1 comprises a switching element (pMOSFET 23) having a control terminal to which the divided voltage of the sum of the driving voltage VCC1 and the negative bias voltage VCC2 is applied and main terminals between which the negative bias voltage VCC2 is applied and two-stage NOT gates 24 and 25 both connected to the main terminal of the pMOSFET 23, for binarizing the negative bias voltage VCC2. The first voltage monitoring circuit 4a1 monitors the sum of the voltages VCC1 and VCC2. When the sum of the voltages VCC1 and VCC2 exceeds the threshold voltage of the pMOSFET 23, the NOT gates 24 and 25 monitors the negative bias voltage VCC2. Therefore, it is possible to prevent the wrong ON of the SiC-MOSFET 5b due to the rise of the driving voltage VCC1 with the negative bias voltage VCC2 not being sufficiently applied.

In the gate drive circuit 109, the driving voltage VCC1 is supplied by the external first power supply (power supply 1) connected between the control terminal and the main terminal of the SiC-MOSFET 5b, and the negative bias voltage VCC2 is supplied by the external second power supply (power supply 2) connected between the main terminal of the SiC-MOSFET 5b and the ground GND. Since the output of the gate drive circuit 109 is cut off when at least one of the driving voltage VCC1 and the negative bias voltage VCC2 which are thus supplied becomes lower than the threshold value, it is possible to prevent the wrong ON of the SiC-MOSFET 5b.

In the gate drive circuit 110, the driving voltage VCC1 is supplied by the external first power supply (power supply 1) connected between the control terminal and the main terminal of the SiC-MOSFET 5b, and the negative bias voltage VCC2 is internally generated as the divided voltage of the driving voltage VCC1. Since the output of the gate drive circuit 110 is cut off when at least one of the driving voltage VCC1 and the negative bias voltage VCC2 which are thus supplied becomes lower than the threshold value, it is possible to prevent the wrong ON of the SiC-MOSFET 5b.

In the gate drive circuit 111 in accordance with the second variation, the first voltage monitoring circuit 4a comprises the comparator 7 for comparing the driving voltage VCC1 or the difference between the driving voltage VCC1 and the negative bias voltage VREG1, as the first monitored voltage, with the threshold value, and the second voltage monitoring circuit 4b2 comprises the two-stage NOT gates 26 and 27 for binarizing the second monitored voltage.

While the invention has been shown and described in detail, the foregoing description is in all aspects illustrative and not restrictive. It is therefore understood that numerous modifications and variations can be devised without departing from the scope of the invention.

What is claimed is:

1. A gate drive circuit for driving an insulated gate switching element, comprising:
    a control drive circuit for applying a driving voltage to a control terminal of said switching element at a predetermined timing; and
    a voltage monitoring circuit for monitoring both a first voltage which is a power supply voltage of said control drive circuit and a second voltage which negatively biases said control terminal,
    wherein said control drive circuit is configured to cut off an output thereof when any one of said first and second voltages monitored by said voltage monitoring circuit becomes lower than a respective first and second threshold value.

2. The gate drive circuit according to claim 1, wherein said voltage monitoring circuit comprises:
    a first voltage monitoring circuit for monitoring said first voltage as a first monitored voltage; and
    a second voltage monitoring circuit for monitoring said second voltage as a second monitored voltage.

3. The gate drive circuit according to claim 2, wherein
    said first voltage monitoring circuit comprises a first comparator for comparing said first voltage with a first threshold value, and
    said second voltage monitoring circuit generates a power supply current of said first comparator with said second voltage.

4. The gate drive circuit according to claim 2, wherein
    said second voltage monitoring circuit comprises a second comparator for comparing said second voltage with a second threshold value, and
    said first voltage monitoring circuit generates a power supply current of said second comparator with said first voltage.

5. The gate drive circuit according to claim 2, wherein
    said first voltage monitoring circuit comprises a comparator for comparing said first monitored voltage with a threshold value, and
    said second voltage monitoring circuit comprises two-stage NOT gates for binarizing said second monitored voltage.

6. The gate drive circuit according to claim 1, wherein said voltage monitoring circuit comprises:
    a first voltage monitoring circuit for monitoring a sum of said first voltage and said second voltage as a first monitored voltage; and
    a second voltage monitoring circuit for monitoring said second voltage as a second monitored voltage.

7. The gate drive circuit according to claim 6, wherein
said first voltage monitoring circuit comprises a comparator for comparing a sum of said first voltage and said second voltage with a threshold value, and
said second voltage monitoring circuit comprises a switching element having a control terminal to which a divided voltage of said sum of said first voltage and said second voltage is applied and main terminals between which said second voltage is applied; and
two-stage NOT gates connected to a main terminal of said switching element, for binarizing said second voltage.

8. The gate drive circuit according to claim 7, wherein
said first voltage is supplied by an external first power supply connected between a control terminal and a main terminal of said switching element, and
said second voltage is supplied by an external second power supply connected between said main terminal of said switching element and a ground.

9. The gate drive circuit according to claim 7, wherein
said first voltage is supplied by an external single power supply connected between a control terminal and a main terminal of said switching element, and
said second voltage is internally generated as a divided voltage of said first voltage.

10. The gate drive circuit according to claim 6, wherein
said first voltage monitoring circuit comprises a comparator for comparing said first monitored voltage with a threshold value, and
said second voltage monitoring circuit comprises two-stage NOT gates for binarizing said second monitored voltage.

11. The gate drive circuit according to claim 1, wherein
said first voltage is supplied by an external first power supply connected between a control terminal and a main terminal of said switching element, and
said second voltage is supplied by an external second power supply connected between said main terminal of said switching element and a ground.

12. The gate drive circuit according to claim 1, wherein
said first voltage is supplied by an external single power supply connected between a control terminal and a main terminal of said switching element, and
said second voltage is internally generated as a divided voltage of said first voltage.

13. A gate drive circuit for driving an insulated gate switching element, comprising:
a control drive circuit for applying a driving voltage to a control terminal of said switching element at a predetermined timing;
a first voltage monitoring circuit for monitoring a first voltage, which is a power supply voltage of said control drive circuit, as a first monitored voltage, said first voltage monitoring circuit comprising a first comparator for comparing said first monitored voltage with a first threshold value; and
a second voltage monitoring circuit for monitoring said second voltage, which negatively biases said control terminal, as a second monitored voltage, said second voltage monitoring circuit comprising a second comparator for comparing said second monitored voltage with a second threshold value,
wherein said control drive circuit is configured to cut off an output thereof when at least one of said first and second monitored voltages becomes lower than a respective first and second threshold value.

14. The gate drive circuit according to claim 13, wherein
a power supply voltage of said second comparator is a sum of said first voltage and said second voltage.

15. A gate drive circuit for driving an insulated gate switching element, comprising:
a control drive circuit for applying a driving voltage to a control terminal of said switching element at a predetermined timing;
a first voltage monitoring circuit for monitoring a sum of a first voltage, which is a power supply voltage of said control drive circuit, and a second voltage, which negatively biases said control terminal, as a first monitored voltage, said first voltage monitoring circuit comprising a first comparator for comparing said first monitored voltage with a first threshold value; and
a second voltage monitoring circuit for monitoring said second voltage as a second monitored voltage, said second voltage monitoring circuit comprising a second comparator for comparing said second monitored voltage with a second threshold value,
wherein said control drive circuit is configured to cut off an output thereof when at least one of said first and second monitored voltages becomes lower than the respective first and second threshold value.

16. The gate drive circuit according to claim 15, wherein
a power supply voltage of said second comparator is a sum of said first voltage and said second voltage.

* * * * *